United States Patent [19]

Knowles et al.

[11] Patent Number: 5,362,964
[45] Date of Patent: Nov. 8, 1994

[54] ENVIRONMENTAL SCANNING ELECTRON MICROSCOPE

[75] Inventors: W. Ralph Knowles, Lowell, Mass.; William G. Schultz, Nashua, N.H.; Allen E. Armstrong, Lexington, Mass.

[73] Assignee: ElectroScan Corporation, Wilmington, Mass.

[21] Appl. No.: 100,545

[22] Filed: Jul. 30, 1993

[51] Int. Cl.$^5$ ............................................. H01J 37/244
[52] U.S. Cl. ..................... 250/310; 250/397
[58] Field of Search ................................. 250/310, 397

[56] References Cited

U.S. PATENT DOCUMENTS

| | | |
|---|---|---|
| Re. 27,005 | 12/1970 | Wingfield et al. |
| 2,899,556 | 8/1959 | Schopper et al. ............... 250/441.11 |
| 2,908,821 | 10/1959 | Schumacher ........................ 250/310 |
| 2,928,943 | 3/1960 | Bartz et al. ............................ 250/311 |
| 2,991,362 | 7/1961 | Schumacher . |
| 3,155,827 | 11/1964 | Nixon ................................... 250/311 |
| 3,248,542 | 4/1966 | Nixon ................................... 250/397 |
| 3,509,335 | 4/1970 | Nixon ................................... 250/311 |
| 3,612,859 | 10/1971 | Schumacher . |
| 3,629,579 | 12/1971 | Naitou ................................... 250/311 |
| 3,761,709 | 9/1973 | Hasegawa et al. ................... 250/311 |
| 3,885,157 | 5/1975 | Heinemann .......................... 250/311 |
| 3,958,124 | 5/1976 | Koch et al. .......................... 250/311 |
| 4,066,905 | 1/1978 | Dassler et al. .................. 250/396 R |
| 4,071,766 | 1/1978 | Kalman et al. ..................... 250/443 |
| 4,121,100 | 10/1978 | Kubozoe et al. ..................... 250/311 |
| 4,233,509 | 11/1980 | Tamura et al. ....................... 250/306 |
| 4,306,149 | 12/1981 | Le Poole et al. .................... 250/311 |
| 4,349,242 | 9/1982 | Ogura ................................... 250/310 |
| 4,410,272 | 10/1983 | Beauvineau et al. ............... 356/311 |
| 4,537,477 | 8/1985 | Takagi et al. ........................ 350/507 |

(List continued on next page.)

FOREIGN PATENT DOCUMENTS 1477458 7/1973 United Kingdom .
2186737 8/1987 United Kingdom .

OTHER PUBLICATIONS

Danilatos, "A Gaseous Detector Device for an Environmental SEM", *Micron and Microscope Acta*, 14(4), pp. 307–318 (1983).

(List continued on next page.)

*Primary Examiner*—Jack I. Berman
*Attorney, Agent, or Firm*—Curtis, Morris & Safford

[57] ABSTRACT

An environmental scanning electron microscope which achieves image resolution comparable to that of a conventional SEM. A biased ring electrode which detects secondary electron signals emanating from the surface of the specimen is provided in the specimen chamber. A biased pressure limiting aperture electron detector is also provided to reduce signals emanating from backscattered electrons and to reduce signal noise generated by the electron beam. This environmental SEM also optimizes the signal amplification of the secondary electrons following detection thereof, such that the detector noise is reduced below the noise in the signal itself, while still maintaining an overall bandwidth that is suitable for setting up the image. An optical window system is also provided in this environmental SEM which allows the user to easily switch between the normal environmental SEM electron image (limited to 0.5 mm in diameter) to an optical light view of the sample that covers a field-of-view of up to about 7 to 10 mm. Moreover, the construction of this environmental SEM provides for a take-off angle for the X-ray detectors (EDX detectors) which is comparable to the take-off angle in for an EDX detector in a conventional SEM. Additionally, the arrangement of the scanning coils and magnetic focusing lens in this environmental SEM provides for an enhanced field-of-view of the specimen.

56 Claims, 8 Drawing Sheets

U.S. PATENT DOCUMENTS

| | | | |
|---|---|---|---|
| 4,596,928 | 6/1986 | Danilatos | 250/307 |
| 4,720,633 | 1/1988 | Nelson | 250/310 |
| 4,727,029 | 2/1988 | Mori | 435/173 |
| 4,740,698 | 4/1988 | Tamura et al. | 250/310 |
| 4,785,182 | 11/1988 | Mancuso et al. | 250/310 |
| 4,798,989 | 1/1989 | Miyazaki et al. | 310/328 |
| 4,823,006 | 4/1989 | Danilatos et al. | 250/310 |
| 4,860,224 | 8/1989 | Cashell et al. | 364/551.01 |
| 4,874,945 | 10/1989 | Ohi | 250/306 |
| 4,880,976 | 11/1989 | Mancuso et al. | 250/310 |
| 4,897,545 | 1/1990 | Danilatos | 250/310 |
| 4,992,662 | 2/1991 | Danilatos | 250/310 |
| 5,023,452 | 6/1991 | Purcell et al. | 250/306 |
| 5,081,353 | 1/1992 | Yamada et al. | 250/306 |
| 5,097,134 | 3/1992 | Kimoto et al. | 250/443.1 |
| 5,200,616 | 4/1993 | Kokawa et al. | 250/306 |

OTHER PUBLICATIONS

Danilatos, "Design and Construction of an Atmospheric or Environmental SEM", (Part 3), Scanning, vol. 7, 26–42 (1985).

Danilatos, G. D., "Improvements on the Gaseous Detector Device", G. D. Bailey, Ed., Proceedings of the 44th Annual Meeting of the Electron Microscopy of America, pp. 630–631 (1986).

Danilatos, G. D., "ESEM—A Multipurpose Surface Electron Microscope", G. W. Bailey, Ed., Proceeding of the 44th Annual Meeting of the Electron Microscopy Society of America, pp. 632–633 (1986).

Danilatos, G. D. et al., "Principles of Scanning Electron Microscopy at High Specimen Chamber Pressures", *Scanning*, vol. No. 2, 1979, pp. 72–82.

ENVIRONMENTAL SCANNING ELECTRON MICROSCOPE

BACKGROUND OF THE INVENTION

This invention relates to the field of environmental scanning electron microscopes, and more particularly, to an environmental scanning electron microscope which achieves standard SEM resolution performance in a gaseous environment.

As background, the advantages of an environmental scanning electron microscope over standard scanning electron microscopes (SEM) lie in its ability to produce high-resolution electron images of moist or non-conductive specimen (e.g., biological materials, plastics, ceramics, fibers) which are extremely difficult to image in the usual vacuum environment of the SEM. The environmental scanning electron microscope allows the specimen to be maintained in its "natural" state without subjecting it to the distortions caused by drying, freezing, or vacuum coating normally required for high-vacuum electron beam observation. Also, the relatively high gas pressure easily tolerated in the environmental scanning electron microscope specimen chamber acts effectively to dissipate the surface charge that would normally build up on a non-conductive specimen, blocking high quality image acquisition. The environmental scanning electron microscope also permits direct, real-time observation of liquid transport, chemical reaction, solution, hydration, crystallization, and other processes occurring at relatively high vapor pressures far above those can be permitted in the normal SEM specimen chamber.

As stated in U.S. Pat. No. 4,992,662, the original concept of an environmental scanning electron microscope, as suggested in U.S. Pat. No. 4,596,928, was to maintain the specimen chamber in a gaseous environment such that the gaseous environment acted as a conditioning medium in order to maintain the specimen in a liquid or natural state. In addition, the utilization of the gaseous environment of the specimen chamber as a medium for amplification of the secondary electron signals is described in U.S. Pat. No. 4,785,182.

In the environmental SEM of U.S. Pat. No. 4,824,006, electron beam observation of unprepared, full-sized specimens at high vacuum pressures was made possible due to the combination of pressure control and signal detection means, housed entirely within the magnetic objective lens of the electron beam column. The environmental SEM design of U.S. Pat. No. 4,823,006 satisfied the simultaneous requirements for pressure control, electron beam focusing, and signal amplification, while providing no practical limitations on specimen handling or microscopic resolving power.

A limitation of the environmental SEM of U.S. Pat. No. 4,824,006, however, is that the field-of-view of the sample is limited by the final pressure limiting aperture. The pressure limiting aperture is necessary to prevent the gas from the specimen chamber affecting the operation of the electron column and absorbing the primary electron beam. This pressure limiting aperture is typically 0.5 millimeters in diameter. This also limits the field-of-view to about a 0.5 millimeter diameter. This limited field-of-view makes it difficult for the operator to know where he or she is on the sample and the location of the desired area of examination.

It is therefore desirable to provide an environmental scanning electron microscope having an optical window system which allows the operator to switch between the normal environmental scanning electron microscope electron image (limited to approximately 0.5 millimeters in diameter) to an optical light view of the sample that covers a field-of-view of about 7 to 10 mm which is comparable with typical field-of-view capabilities of an SEM.

U.S. Pat. No. 4,897,545 describes a more complex detector arrangement than that disclosed in U.S. Pat. No. 4,824,006 which allows for the detection of other signals (i.e., backscattered electrons) in the gas, utilizing a set of differently biased electrodes. U.S. Pat. No. 4,897,545 discusses that various electrodes can be used to collect different signals from the specimen chamber, but fails to discuss how the signal from one electrode might be optimized by a suitable bias on another electrode. In addition, in U.S. Pat. No. 4,897,545, there is no mention of the concept of using an electrode as a collector of unwanted signals or using an electrode to reduce signal noise produced by the primary beam. It would therefore be desirable to provide an environmental SEM which improves secondary electron detection by reducing the backscattered electron component of the signal and the signal noise produced by the primary beam.

In comparison to the environmental SEM of U.S. Pat. No. 4,824,006 and 4,897,545, it has also been found desirable to provide an environmental SEM which optimizes signal amplification following detection of the desired secondary electrons such that the detector noise is reduced below the noise in the signal itself, while still maintaining an overall signal bandwidth that is suitable for setting up the image.

Most modern SEMs utilize a method to enable an electron beam to be scanned over the sample in order to construct an image of the sample, or to collect other information from the sample, such as X-ray data. These methods allow a large part of the sample to be scanned with acceptably low geometric distortion of the image of the sample. In a typical SEM, the electron gun generates a relatively large (20 micrometer) source of electrons which must be demagnified to the small size required to image small details on the sample. This demagnification is typically produced by three electron lenses in the optical vacuum column. Only a small proportion of the electrons reach the sample as the final beam is conveniently referred to as a "pencil beam" (see reference numeral 2 in FIG. 1).

As is shown in FIG. 2, in order to scan the primary beam along the length of the vacuum column, scanning coils, such as 3 and 4, are positioned in the objective lens assembly 5. If a current is passed through the two sets of scanning coils 3 and 4, the pencil beam will be deflected as shown in FIG. 2.

In the previous environmental SEM of FIG. 3, two pressure limiting apertures 6 and 7 allow high pressure in the specimen chamber 8 (e.g., approximately 5 Torr) while maintaining a high vacuum (e.g., approximately 0.0001 Torr) in the region of the scanning coils 9a and 9b. As these pressure limiting apertures are normally 0.3 mm to 0.5 mm in diameter, they limit the field-of-view of the specimen, as aforementioned, to about 0.5 mm in diameter. In contrast, a typical SEM will allow at least ten times this amount under comparable working conditions. It is therefore desirable to provide a scanning coil deflection system for an environmental scanning electron microscope having at least two pressure limiting apertures which has an enhanced field-of-view.

Moreover, in the prior environmental SEM, such as the environmental SEM of U.S. Pat. No. 4,824,006, the take-off angle of the X-ray detector (EDX detector) is not comparable to the take-off angle of the EDX detectors of conventional SEMs. As is shown in FIG. 4, in a conventional SEM, the conical base 201 of the objective lens 202 allows the energy dispersive X-ray detector (EDX) 203 to collect X-rays emanating from the surface of the sample at a take-off angle of approximately 30%, without the bulk of the EDX detector intruding into the sample space.

In environmental SEMs, however, as is shown in FIG. 5, the objective lens 204 with a flat lower pole piece 205 and the gas manifolds 206 and 207 (used to withdraw the gas that passes through the pressure limiting aperture) are at the same level. Since the working distance between the specimen and the data acquisition devices in an environmental SEM must be kept as short as possible, the space that the EDX detector can occupy in the specimen chamber is restricted. Thus, in order to limit this working distance, the design of the environmental SEM of FIG. 5 limits the take-off angle of the EDX detector 208 in the specimen chamber to approximately 20°. It is therefore desirable to provide an environmental SEM which provides for a take-off angle of the EDX detector which is comparable with the take-off angle of EDX detectors in conventional SEMs.

OBJECT OF THE INVENTION

Therefore, it is an object of the present invention to provide an improved environmental scanning electron microscope which avoids the aforementioned deficiencies of the prior art.

It is also an object of this invention to provide an improved environmental scanning electron microscope which permits direct real-time observation of liquid transfer, chemical reactions, solutions, hydration, crystallization and other processes occurring at relatively high vapor pressures.

It is another object of this invention to provide an environmental scanning electron microscope which satisfies the simultaneous requirements for pressure control, electron beam focusing and signal amplification while placing no practical limitations on specimen handling or microscope resolving power.

It is a further object of the invention to provide an improved environmental scanning electron microscope which achieves standard SEM resolution in a gaseous environment.

It is a further object of this invention to provide an improved environmental scanning electron microscope having an improved secondary electron detector which reduces the backscattered electron component of the signal emanating from the specimen and reduces the signal noise produced by the primary beam.

It is yet another object of this invention to provide an improved environmental scanning electron microscope which allows the electron beam to strike a greater surface area of the specimen, and thus, provide for an enhanced field-of-view of the specimen comparable to that of a standard SEM.

It is a still further object of this invention to provide an improved environmental scanning electron microscope which has an improved amplifier for the signal received by the secondary electron detector.

It is still a further object of this invention to provide an improved environmental scanning electron microscope which has an improved method of observing large samples.

It is still a further object of this invention to provide a scanning electron microscope which allows an optical view of the sample while simultaneously utilizing a gaseous detector.

It is still a further object of this invention to provide an improved environmental scanning electron microscope which has an enhanced take-off angle for an EDX detector which is comparable with the take-off angle for an EDX detector of a standard SEM.

Various other objects, advantages and features of the present invention will become readily apparent from the ensuing detailed description and the novel features will be particularly pointed out in the appended claims.

SUMMARY OF THE INVENTION

This invention relates to an improved environmental scanning electron microscope which achieves standard SEM resolution performance in a gaseous environment.

In a preferred embodiment thereof, the electron microscope includes an electron gun for generating and directing an electron beam towards a specimen to be examined. In the objective lens assembly of this environmental scanning electron microscope, the electron beam passes through an electron optical column until it reaches a differentially pumped aperture column. In the differentially pumped aperture column, the electron beam is focused and scanned across the diameter of the final pressure limiting aperture.

A specimen chamber is positioned below the objective lens assembly and is capable of maintaining the specimen enveloped in gas in registration with the pressure limiting aperture such that a surface of the specimen may be exposed to the focused beam of electrons. A specimen mount is located within the specimen chamber and is positioned for supporting the specimen approximately 1 to 25 mm below the pressure limiting aperture so as to allow the focused beam of electrons to interact with the specimen.

In accordance with one of the general objects of the present invention, this environmental SEM includes an electron detector configuration which reduces the backscattered electron component of the signal emanating from the surface of the sample and reduces the signal noise produced by the primary electron beam. More specifically, this configuration includes a biased pressure limiting aperture electrode detector formed integrally with the pressure limiting aperture and a biased ring electrode provided at or just below the final pressure limiting aperture within the specimen chamber and above the surface of the specimen. This ring electrode assembly is formed of a thin ring structure having a thickness of approximately 50 to 1000 microns and is made of an electrically conductive material, such as metal, pyrolytic graphite, etc. The ring electrode is suitably biased such that desired signals from secondary electrons emanating from the surface of the sample are collected thereon.

In this environmental SEM, the pressure limiting aperture detector electrode is suitably biased such that the undesired secondary electrons, including (1) secondary electrons generated by collisions between the primary beam and the gas in the specimen chamber, (2) secondary electrons generated by collisions between backscattered electrons that pass through the pressure limiting aperture and the gas in the specimen chamber, 3) secondary electrons generated by collisions between backscattered electrons which pass through the gas between the sample and the rest of the specimen chamber, and (4) secondary electrons produced by backscattered electrons striking the pressure limiting aperture, are intercepted and collected by the pressure limiting aperture electrode. Accordingly, these undesirable secondary electron signal components are not collected by the ring electrode, and the secondary electron image derived from the ring electrode is a more pure secondary electron image which also exhibits a lower noise level.

In accordance with another general object of the present invention, this environmental SEM includes an improved amplifier for amplifying the signals collected by ring electrode. This amplifier floats at the bias voltage of the ring electrode and the output of the amplifier is supplied to a video display. The amplifier has a feedback mechanism including a resistor having a resistance value of R. The output signal of the amplifier is amplified to restore the high frequency signal lost due to the effect of R. In addition, the amplifier is operated in a so-called virtual earth or ground mode.

Advantageously, this amplifier maintains the voltage on the ring electrode to be very close to V1. With this design, noise at the output of the amplifier is also reduced such that the dominant source of noise in this environmental SEM is from the shot noise in the beam. In order to achieve this reduction, the resistor R is at least 1M ohm.

The environmental SEM of the present invention also permits the operator to easily switch between a normal environmental scanning electron microscope electron image (typically limited to 0.5 mm in diameter) to an optical light view of the sample that covers a field-of-view of up to approximately 7 to 10 mm. The optical windowing system of this environmental scanning electron microscope includes (1) an optical image production system to illuminate the specimen from a light source and reflects the image of the specimen to provide a continuous optical view thereof, and (2) an optical display system that allows the optical image to be shown on an environmental SEM display and control screen.

In the optical image production system, a relatively small mirror is mounted to the magnetic focusing lens and faces the specimen. The sample is illuminated by reflecting light off the mirror (and the underside of the objective lens). The mirror is also used to collect the image of the sample and send it back through a lens onto a charge-coupled device ("CCD") TV camera. The TV signal from the camera is supplied directly into a standard TV monitor to provide a continuous optical view of the sample. With this optical image production system, a view of the sample is obtained which is substantially equivalent to a "top down" view.

The optical display system includes a screen having an image display area and a menu display area for displaying operational and status information for an operator. In the image display area, either the electron images received by the ring electrode or optical images produced by the optical image production system may be displayed. Furthermore, in the image display area, electron images of the sample may be inserted in the optical images as a "picture-in-picture" display and vice versa such that the operator can switch instantly between selected optical and electron images of the sample.

In this environmental SEM, the take-off angle of the X-ray detector (EDX detector) is comparable with the take-off angle of an EDX detector of a conventional SEM. In order to obtain a take-off angle of approximately 30°, the pressure limiting aperture assembly extends downwardly from the final pole piece such that the specimen is positioned approximately 1 to 25 mm below the pressure limiting aperture.

A further advantageous feature of the environmental SEM of the present invention is that the field-of-view of the specimen is enhanced and comparable to the field-of-view of a standard SEM. In order to increase the surface area of the specimen which is impinged by the primary beam, the objective lens assembly includes a scanning assembly which provides for triple deflection of the electron beam through two pressure limiting apertures and a magnetic lens housing of reduced focal length. As a result of this design, the environmental SEM achieves a field-of-view of the specimen of up to approximately 7 to 10 mm.

BRIEF DESCRIPTION OF THE DRAWINGS

The following detailed description, given by way of example, but not intended to limit the invention solely to the specific embodiments described, may best be understood in conjunction with the accompanying drawings in which.

DETAILED DESCRIPTION OF THE PREFERRED EMBODIMENT

Figure 1:
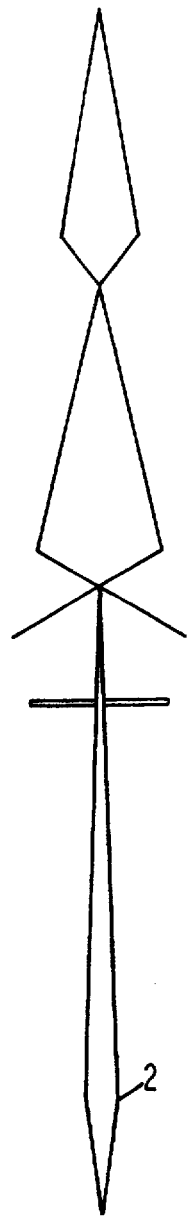
FIG. 1 is a schematic diagram of the electron beam in a typical SEM column.
Figure 2:
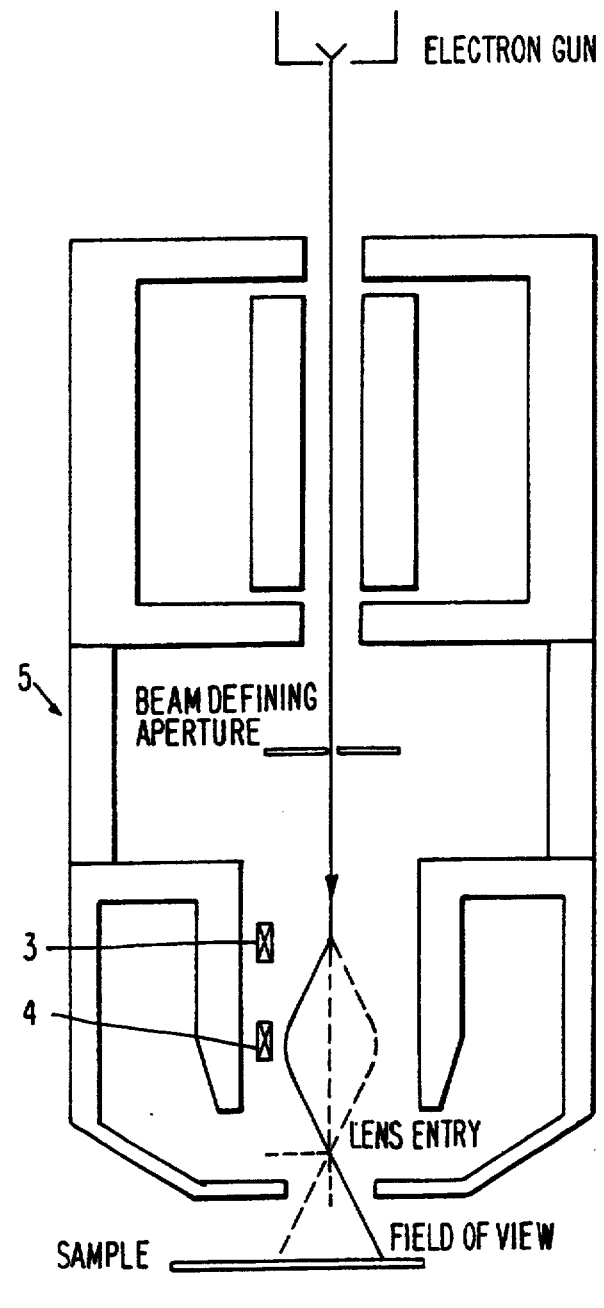
FIG. 2 is a schematic representation of the beam deflection in a typical SEM column.
Figure 3:
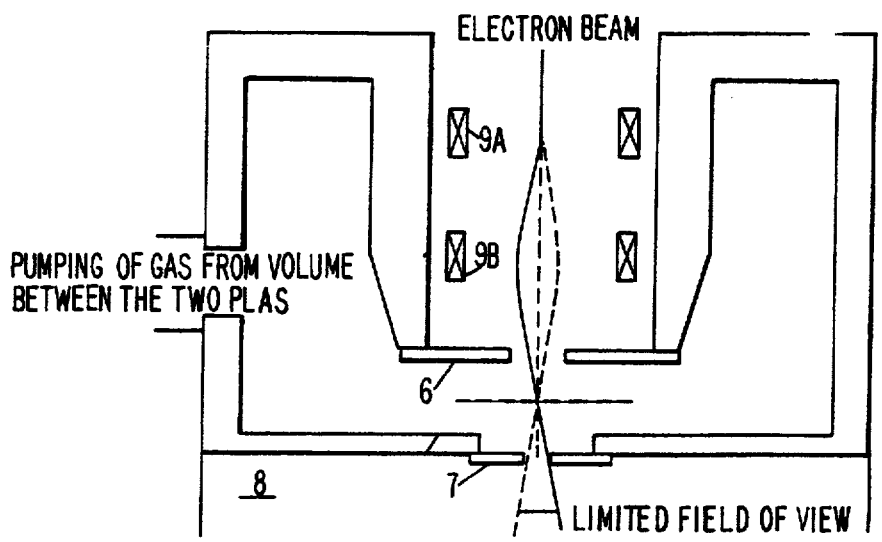
FIG. 3 is a schematic representation of the beam deflection in an environmental scanning electron microscope having two sets of scanning coils and two pressure limiting apertures.
Figure 4:
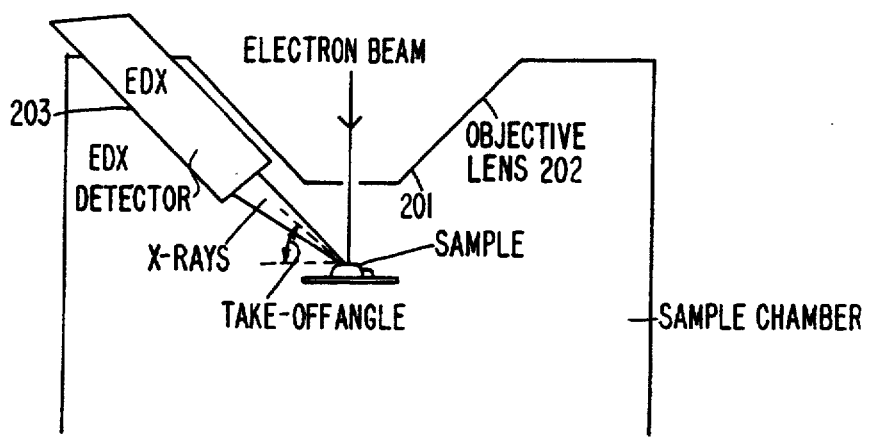
FIG. 4 is a schematic representation of an X-ray detector configuration present in modern SEMs.
Figure 5:
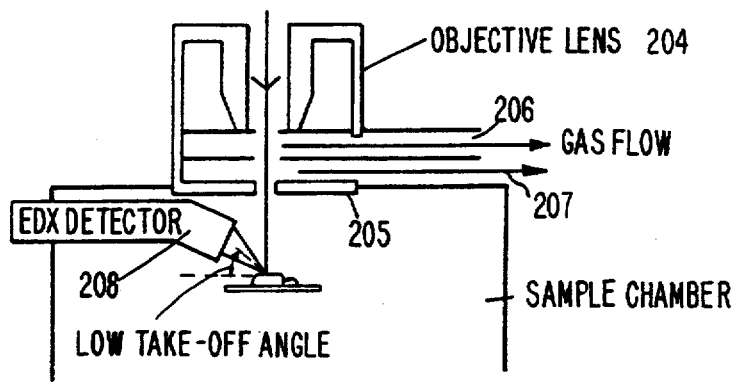
FIG. 5 is a schematic representation of the configuration for an X-ray detector in a prior art environmental scanning electron microscope.
Figure 6:
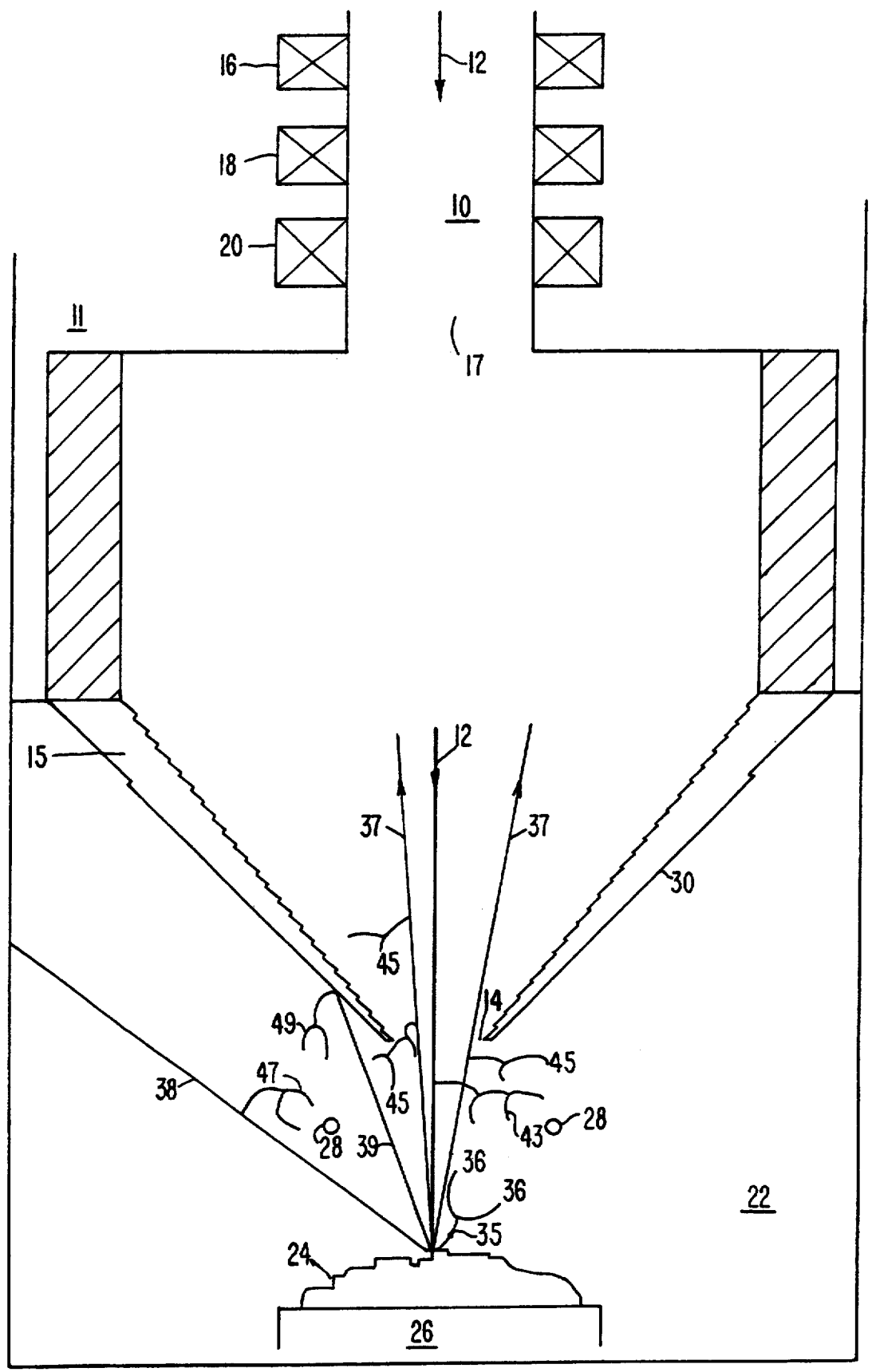
FIG. 6 is a schematic representation of an example of electron trajectory paths in an environmental scanning electron microscope.

Referring now to FIG. 6, an environmental scanning electron microscope is illustrated which provides a device for generating, amplifying and detecting secondary and backscattered electrons emanating from a surface of a sample being examined. A beam of electrons 12 is emitted through an electron optical column 10 of the objective lens assembly 11 by an electron gun (not shown). The vacuum optical column 10 includes a final pressure limiting aperture 14 at its lower end thereof. This pressure limiting aperture 14 is formed within the lower end of an aperture carrier 15. This aperture carrier 15 is discussed in U.S. patent application Ser. No. 07/908,870, filed Jul. 1, 1992, the subject matter of which is incorporated by reference. This aperture carrier includes a second pressure limiting aperture 17 above final pressure limiting aperture 14 which communicates directly with the electron optical column 10. Preferably, the final pressure limiting aperture 14 has a diameter of approximately 500 microns. The electron beam passes through magnetic lenses 16 and 18 which are used to control the intensity of the electron beam. Focusing means 20 located within the objective lens assembly 11 adjacent to the vacuum column and is capable of directing the beam of electrons through the final pressure limiting aperture 14.

The beam is subsequently directed into a specimen chamber 22 through final pressure limiting aperture 14 wherein it impinges upon a specimen 24 supported on a specimen stage 26. The specimen mount or stage 26 is located within the specimen chamber 22 and is positioned for supporting specimen 24 approximately 1 to 25 mm, and preferably 1 to 10 mm, below final pressure limiting aperture 14 so as to allow the beam of electrons to interact with the specimen. The specimen chamber is disposed below the optical vacuum column 10 and is capable of maintaining the sample 24 enveloped in gas, preferably nitrogen or water vapor, at a pressure of approximately between 1 to 50 Torr in registration with the pressure limiting aperture such that a surface of the specimen may be exposed to the charged particle beam emitted from the electron gun and directed through the pressure limiting aperture 14.

As is shown in FIG. 6, a ring detector 28 is provided in the specimen chamber between the final pressure limiting aperture 14 and the specimen 24. This ring electrode detector is preferably formed of a thin ring and made of metal. In the preferred embodiment, the wire thickness of the ring detector is approximately 50 to 1000 microns. The diameter of the ring detector 28 is slightly larger than the diameter of the pressure limiting aperture 14 and is placed immediately below and separated therefrom.

When the primary beam 12 strikes the specimen 24, as in FIG. 6, secondary electrons 35 and backscattered electrons, such as 37, 38 and 39, are released from the sample. For purposes of illustration, in FIG. 6, a bias voltage is applied to ring electrode 28 of approximately +500 V. The bullet detector 30 which forms the pressure limiting aperture 14 is unbiased. In this configuration, high positive voltage on the ring electrode 28 causes the secondary electrons 35 emanating from the surface of the sample to be accelerated until they strike gas molecules of the gaseous environment in the specimen chamber 26. Multiple collisions with the gaseous environment cause other electrons to be released which are, as well, accelerated towards the ring electrode 28. Generally, there will be many such collisions and eventually a cloud of hundreds or thousands of electrons will reach the ring electrode 28. The main objective, however, of the ring electrode 28 is to collect the electrons triggered by secondary electrons emanating from the specimen 24.

However, as illustrated in FIG. 6, secondary electrons are also generated by gas collisions from other sources; namely:

a) collisions between the primary beam 12 and the gaseous environment of the specimen chamber, these secondary electrons being represented by reference numeral 43 in FIG. 6;

b) collisions between the backscattered electrons 37 that pass through the pressure limiting aperture 14 and the gaseous environment of the specimen chamber 22, these secondary electrons being represented heard to by reference numeral 45;

c) collisions between the backscattered electrons 38 which pass through the gaseous environment between the sample 24 and the remainder of the specimen chamber, these secondary electrons being represented by reference numeral 47; and d) backscattered electrons 39 which strike the pressure limiting aperture 14, and generate secondary electron which are referred to by reference numeral 49.

All of the secondary electrons generated by these collisions are amplified by gas multiplication in the gaseous environment of the specimen chamber and add to the desired secondary electron signal. However, the secondary electrons that derive from the backscattered electrons, such as 43, 45, 47 and 49, add an undesired backscattered component to the secondary electron image being received by the ring detector 28. Furthermore, the secondary electrons 43 created by collisions between the primary beam 12 and the gaseous environment of the specimen chamber cause an undesired background noise component.

Thus, in order to enhance its signal capabilities, the environmental scanning electron microscope of the present invention incorporates an improved secondary electron detector which reduces the backscattered electron component of the signal, such as signals 43, 45, 47 and 49 present in the FIG. 6 example, and reduces the signal noise produced by the primary beam, such as signal 43. In the embodiment of the present invention shown in FIG. 7, the ring electrode 28 is biased at an electrical potential between approximately 200 and 2000 volts, and preferably 500 volts. Additionally, a pressure limiting aperture electrode 50 is formed integrally with the bullet detector defining the pressure limiting aperture and is biased at an electrical potential between 200 and 2000 volts, and preferably 500 volts. In the preferred embodiment, it has been found desirable to bias the ring electrode 28 and the pressure limiting aperture electrode 50 at the same electrical potential.

As an example, if the ring electrode 28 and pressure limiting aperture electrode 50 are both biased at 500 volts, the desired secondary electrons 35 are accelerated and multiplied in the gaseous environment of the specimen chamber 22 to generate further secondary electrons 36 which are still collected by the ring electrode 28. However, in this configuration, most of the undesired secondary electrons are intercepted by the pressure limiting aperture electrode 50. More specifically, the secondary electrons 45 generated by collisions with the backscattered electrons 37 are attracted to the positive surface of the pressure limiting aperture electrode 50. Further, many the secondary electrons generated by collisions between the primary beam 12 and the gaseous environment of the specimen chamber 22 are also attracted to the pressure limiting aperture electrode 50. In addition, the secondary electrons 49 generated by collisions between a backscattered electron 39 and the pressure limiting aperture 50 will no longer be accelerated away from the pressure limiting aperture and no gas amplification occurs. Accordingly, most of the undesirable signal components are not collected by the ring electrode 28, and accordingly, the image signal derived from the ring electrode 28 is a more pure secondary electron image having a lower noise level. Thus, it has been found that this design provides for imaging resolution capabilities of the specimen of about 40 nm which is comparable to the resolution quality of a standard SEM.

Figure 7:
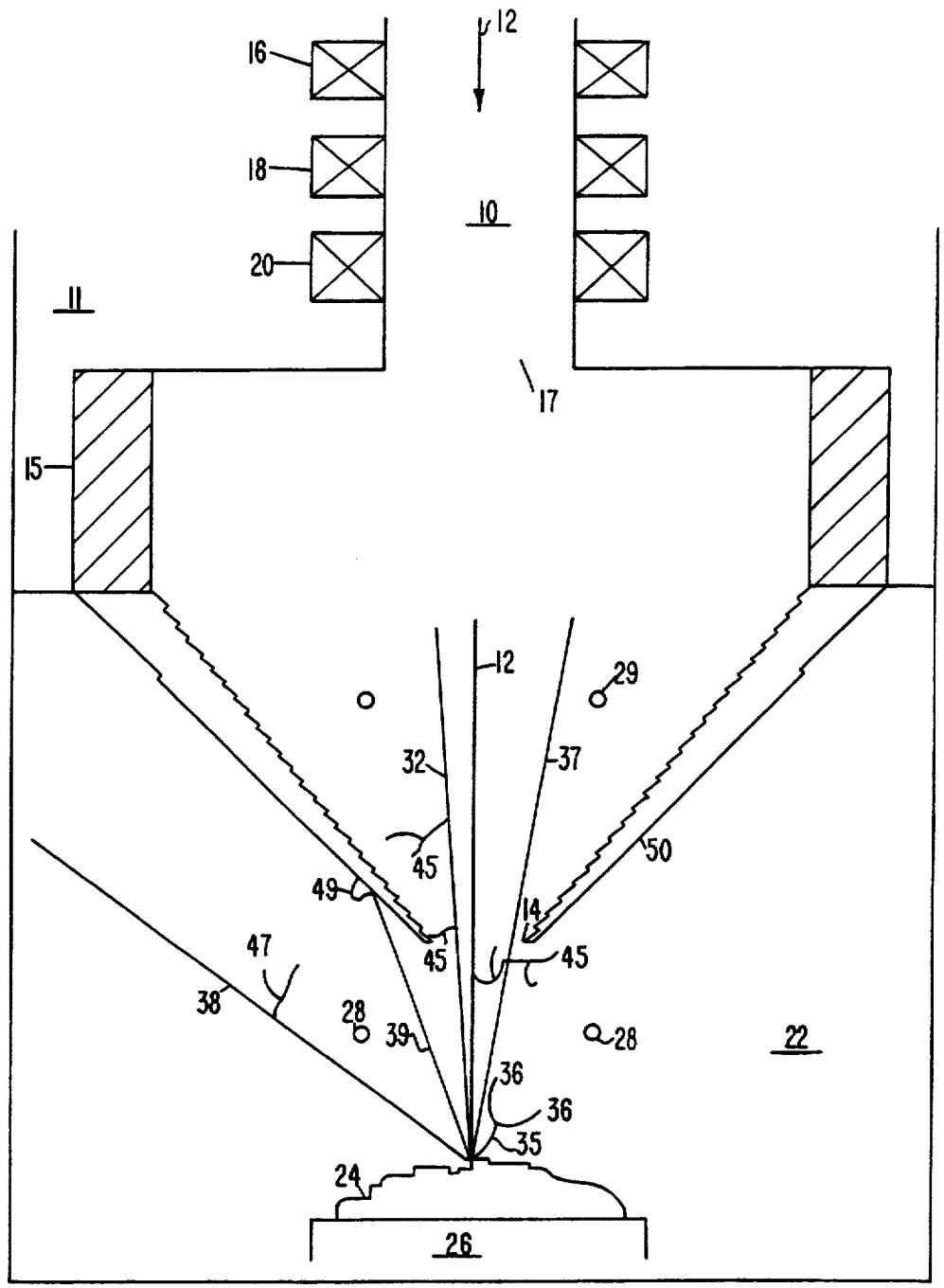
FIG. 7 is a schematic representation of one preferred embodiment of the environmental scanning electron microscope of the present invention illustrating the preferred electron path trajectories.

As an alternate embodiment, in order to collect undesired secondary electrons, a second biased ring electrode 29 may also be positioned above final pressure limiting aperture 14 within the aperture carrier 15 (see FIG. 7). This electrode 29 is also formed of a thin ring and made of metal.

Figure 8:
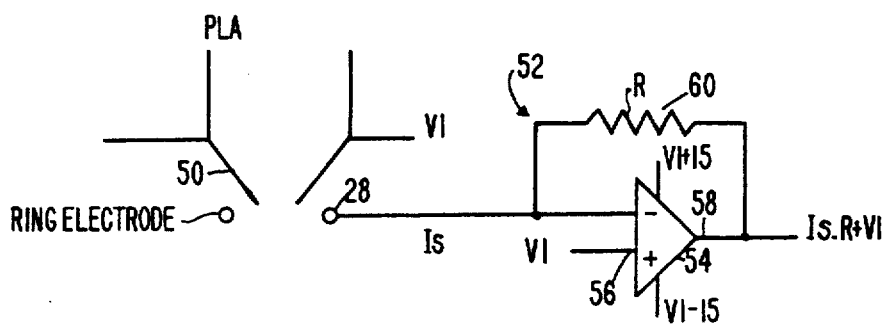
FIG. 8 is a schematic representation of the improved signal amplifier system used in conjunction with the environmental scanning electron microscope of the present invention.

As is shown in FIG. 8, the environmental scanning electron microscope of the present invention also includes an improved amplifier assembly 52 for the signal emanating from the ring detector electrode 28. In this environmental scanning electron microscope, the signal current from the ring electrode 28 is passed to a current amplifier 54 used in the so-called virtual earth mode. As aforementioned, the ring electrode 28 and the pressure limiting aperture electrode 50 are typically best operated at the same DC bias voltage (V1) (in the example of FIG. 7, at approximately at 500 V). This voltage is set to the voltage necessary to obtain sufficient gas multiplication in the specimen chamber. The virtual earth amplifier of FIG. 8 is operated from a power source which floats relative to the bias voltage applied to the ring electrode 28. The other input of the amplifier (the+input designated at 56) is also connected to the bias voltage. The output of the amplifier as at 58 is translated to be relative to normal ground potential utilizing an optically coupled amplifier system of conventional design (not shown).

This amplifier also includes a feedback system in the form of a resistor 60 having a resistance value of R. As a result thereof, the output of the amplifier 54 is represented by IsR+V1 wherein Is is the current collected by the ring electrode 28 and V1 is the bias voltage applied to the amplifier. As a result thereof, the amplifier 54 maintains the voltage on the ring electrode 28 to be very close to V1.

In addition to the required signal (IsR), noise is also present at the output of the amplifier 54. This noise is produced by a number of sources; namely: (a) shot noise in the signal current Is, (b) noise generated by the amplifier, and (c) Johnson noise from the resistor 60. When the environmental SEM of the present invention is used to obtain the smallest spot size of the sample in order to obtain the best image resolution of the specimen, the image must be scanned at a relatively slow scanning speed to minimize the image noise. Typically, a time of between approximately 1 and 2 minutes is utilized.

In order to achieve this reduction the resistor R is preferably at least 1M ohm. This high resistance value limits the frequency response of the amplifier 54 so that it is difficult to obtain a suitable image at fast scanning rates. In order to obtain a suitable image, another amplifier (not shown) is utilized with boosted high frequency response, which compensates for the loss at the input. In the previous environmental SEM, the amplifier used a small resistor (50 k ohm) in order to obtain suitable high frequency response for fast scanning. This resistor, however, generated undesirable levels of Johnson noise. Accordingly, the amplifier system 52 of FIG. 8 has also been designed as set forth above such that the predominant source of noise is from the shot noise in the electron beam 12.

In accordance with another general object of the present invention, the environmental scanning electron microscope of the present invention includes an improved method of observing large samples utilizing a form of an optical microscope. This optical window system allows the user to easily switch between the normal environmental SEM electron image (typically limited to 0.5 mm diameter) to an optical light view of the specimen that covers a field-of-view of up to approximately 7 to 10 mm to achieve in effect an improved SEM that permits an optical view of the specimen. In addition to showing a significantly larger view of the sample, this optical window system advantageously provides an image of the sample which is a normal optical image in full color. Moreover, as will be explained in more detail below, this optical window system provides for a view of the specimen as if one were looking down into the electron column of the microscope.

This environmental scanning electron microscope exploits the existing characteristics of a gaseous detector (i.e. a detector immersed in the gaseous environment of the specimen chamber), which is that the detector is immune to the effects of light in the specimen chamber 22. In contrast, the standard Everhardt-Thornley detector used for secondary electron imaging in a conventional SEM utilizes a photomultiplier that is sensitive to the visible spectrum, and accordingly, it is impossible to allow visible light into the SEM specimen chamber. Moreover, the backscattered electron detectors utilized in SEMs are similarly light sensitive.

Figure 9:
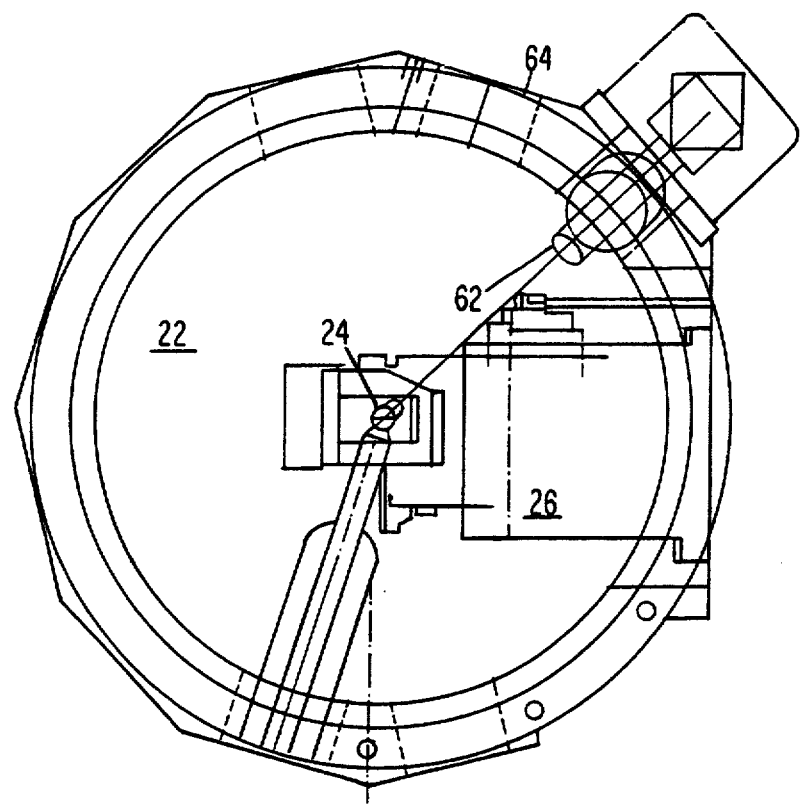
FIG. 9 is a top plan view of the optical system provided in the environmental scanning electron microscope of the present invention.
Figure 10:
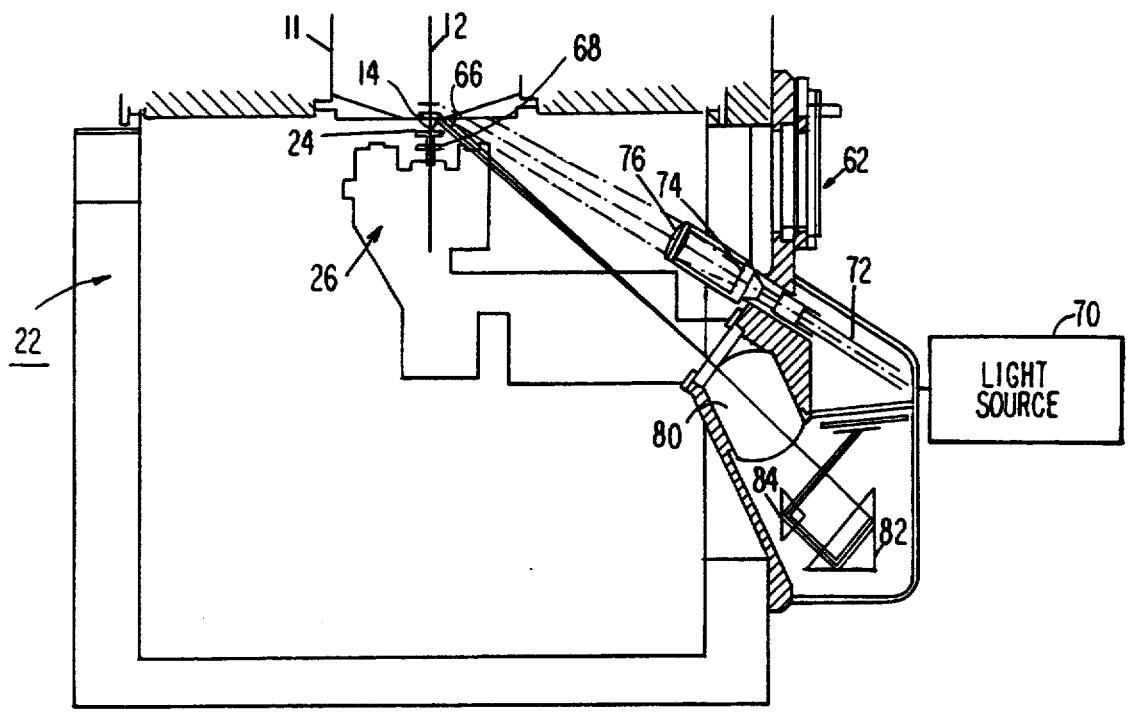
FIG. 10 is a side elevational view of the optical system provided in the environmental scanning electron microscope of the present invention.
Figure 11:
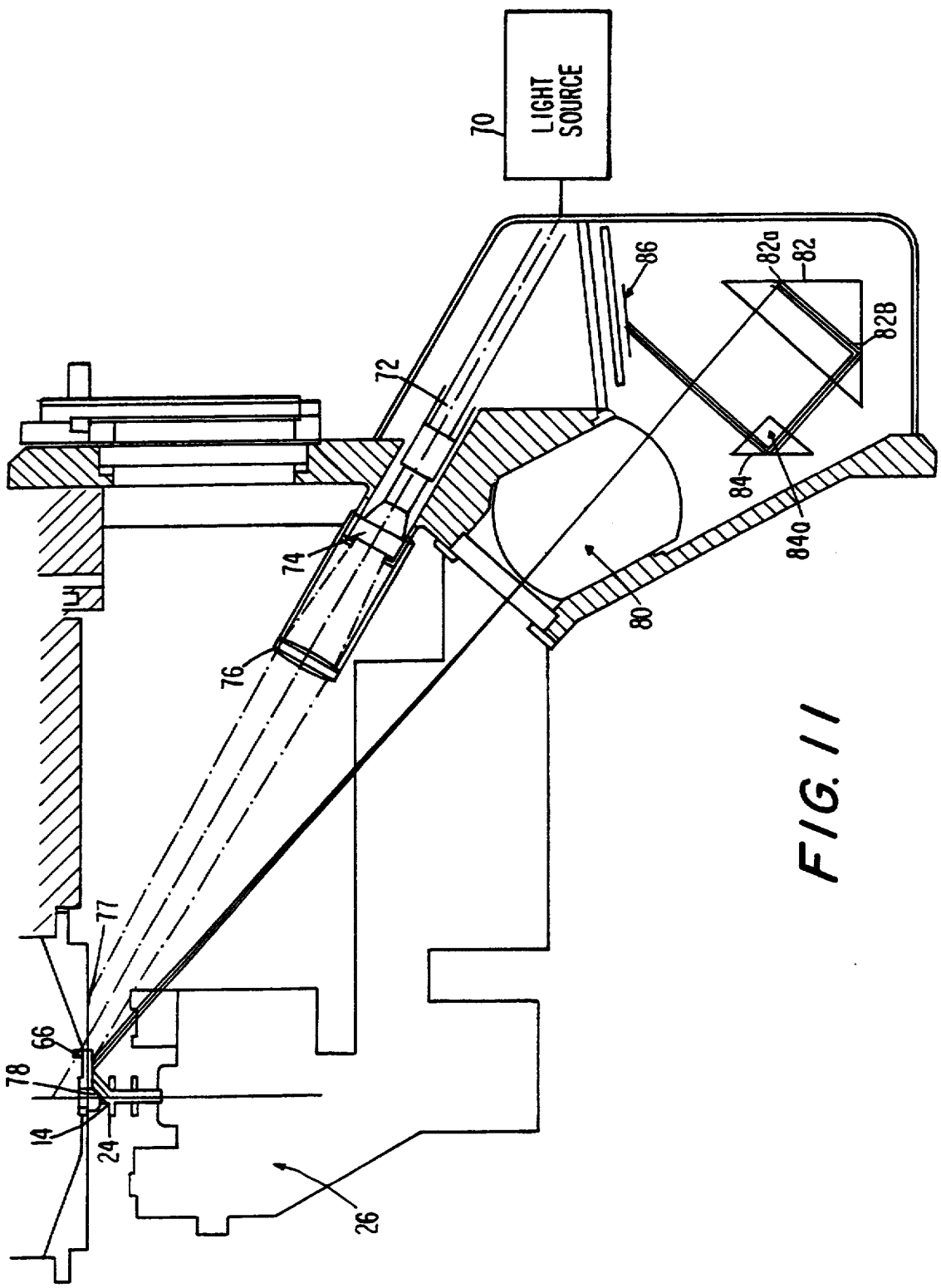
FIG. 11 is an enlarged side elevational view of the optical system of FIG. 10.

The two major components of the optical window system of this environmental scanning electron microscope are as follows:

(a) an optical image production system for illuminating the specimen from a light source and for reflecting the image of the specimen to a video unit to provide a continuous optical view of the specimen, as is illustrated in FIGS. 9 through 11; and (b) a video switching signal or video display system that allows the image from the TV camera to be shown on the normal environmental SEM display and control screen, as is illustrated in FIG. 12 and FIGS. 13a-d.

Referring now to FIGS. 9 and 10, in this environmental SEM, the specimen 24 is mounted in the specimen chamber 22 on a motorized stage 26 to provide for movement in five axes (XYZ, tilt and rotate). A view port 62 extending through the outer housing 64 of the specimen chamber 22 of the environmental SEM is also provided to allow the operator to directly view the sample during examination.

As is best shown in FIGS. 10 and 11, the optical image production system of the optical window system includes a relatively small mirror 66 mounted to the underside of the final pole piece 68 of the magnetic focusing lens, or an optically polished reflecting surface of the final pole piece. In this position, the mirror 66 faces the specimen 24. The specimen is illuminated by reflecting light off the mirror 66 (and/or, as will be explained below, the underside of the objective lens 68). The mirror is also utilized to transmit the image of the sample 24 back through a lens assembly onto a relatively small CCD TV camera. The TV signal from the camera can be directly transmitted into a standard TV monitor to provide a continuous optical view of the sample.

More specifically, as shown in FIGS. 10 and 11, the light source 70 is coupled through an optical fiber bundle 72 and then through a lead glass window 74. The lead glass window 74 provides a vacuum seal and absorbs any X-rays generated by the electron beam 12 emanating from the sample 24. The light is then focused by a lens 76 and reflected off the mirror 66 onto the sample 24. In the preferred embodiment, as shown in FIG. 11, the mirror 66 is positioned very close to the gaseous detector 28 of the environmental SEM of the present invention. In a further preferred embodiment, if the underside or final pole piece 77 of objective lens 68 is sufficiently polished, the mirror 66 could be eliminated and the light beam could be reflected off the final pole piece 77 onto the sample.

The image from the sample 24 is reflected by the mirror 66 back through a lens assembly 80. After the image passes through lens 80 on its return path, it passes through two sets of prisms 82 and 84 before reaching the CCD image integrated circuit 86 which provides a video display of the image. As is best shown in FIG. 11, the first prism 82 is positioned in the optical system of the present invention such that the image is deflected in a 180° orientation from which it was received. Accordingly, the image is reflected by the prism 82 at two deflection points 82a and 82b. After the image is deflected at deflection point 82b of prism 82, it passes through prism 84 and is deflected only once, at deflection point 84a at a right angle towards the CCD image integrated circuit 86. An even number of reflections between the sample and image CCD ensures a non-reversed image.

Normally, an undesirable oblique view of the sample is obtained utilizing a mirror which is offset from the specimen. In the optical window system of the present invention, the lens 80 and the CCD imaging chip 86 are mounted at an angle from each other in order to obtain a view of the sample that is virtually equivalent to a "top down" view of the sample. In addition, the CCD chip 86 is mounted such that the image formed is as the user would see the sample looking down the electron optical column from the front of the microscope. In the preferred embodiment, the CCD imaging chip 86 is operatively connected to a CCD TV camera with the TV signal from the camera being directly transmitted into a standard TV monitor or video recorder to give a continuous optical view of the specimen.

Figure 12:
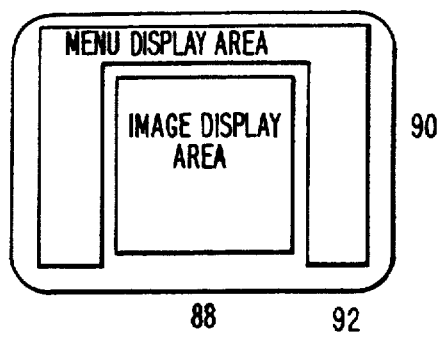
FIG. 12 is schematic representation of the screen display for the image display system of the environmental scanning electron microscope of the present invention.

The video display assembly of the optical window system shown in FIG. 12 includes VGA display screen 88 including a menu display area 90 and an image display area 92. The menu display area 90 displays operational and status information for an operator.

Figures 13A, 13B, 13C, 13D:
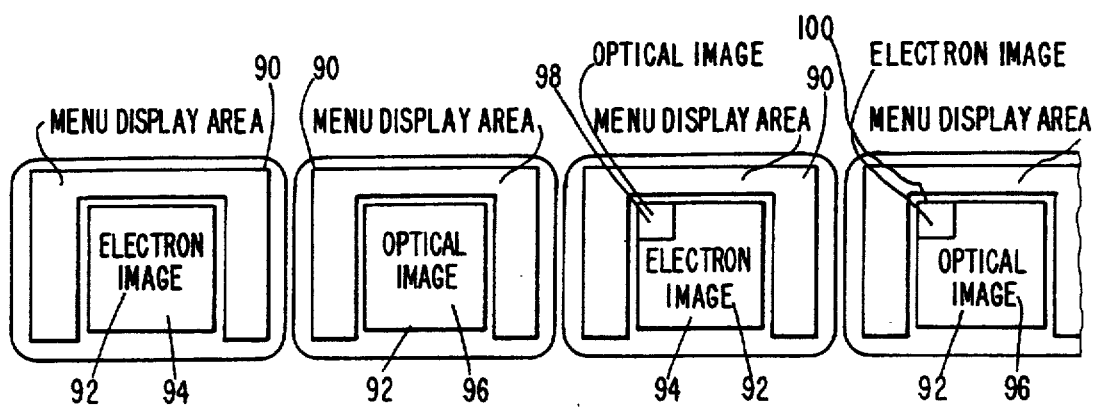
FIGS. 13a–d are schematic representations of four possible image combinations for the screen display of FIG. 12.

As is shown in FIGS. 13a and 13b, the image display area 88 can display either electron images processed from the ring electrode 28 or optical images produced by the optical image production system as described above. A further advantageous feature of the optical display assembly of the present invention is its ability to insert electron images or optical images in the image display area as a "picture-in-picture" display which allows numerous electron images and optical images of the specimen to be instantaneously viewed. As is shown in FIG. 13c, optical images 98 are inserted in the electron images 94 of the image display area as a "picture-in-picture" display. In FIG. 13d, electron images 200 are inserted in the optical images 96 of the image display area 92 as a "picture-in-picture" display. Thus, reduced size versions or selected portions of either the optical images 98 in FIG. 13c or the electron images 100 in FIG. 13d can be displayed in the other image. Electronic circuitry is provided which would be readily appreciated by one skilled in the art to switch the images instantly between the combinations shown in FIGS. 13a–d.

Figure 14:
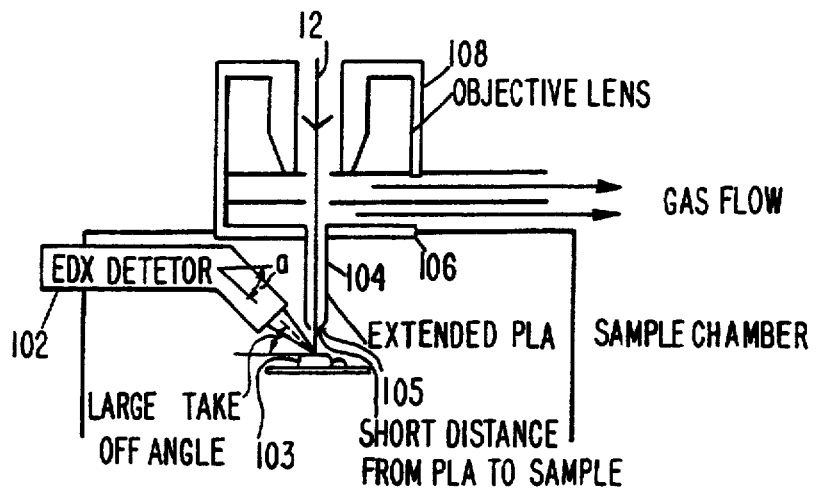
FIG. 14 is schematic representation of the X-ray detector assembly present in the environmental scanning electron microscope of the present invention.

As is shown in FIG. 14, in a preferred embodiment of the environmental SEM of the present invention, the X-ray detector (EDX detector) 102 has a take-off angle for collecting X-rays emitted from the surface of the sample which is comparable with the take-off angle in conventional SEMs of approximately 30°. In order to achieve this desired take-off angle, the pressure limiting aperture assembly 104 is extended downwardly from the final pole piece 106 of the objective lens 108 which separates the vacuum column from the specimen chamber. This extended pressure limiting aperture assembly is utilized to ensure that the gas path length from the pressure limiting aperture 105 to the specimen 103 remains approximately 1 to 25 mm, and more preferably 1 to 10 mm. As a result thereof, the distance from the final pole piece 106 of the objective lens 108 to the specimen 103 is increased to allow enough space in the specimen chamber to provide an EDX detector with an increased take-off angle of approximately 30° represented by the angle $\alpha$ in FIG. 14.

Figure 15:
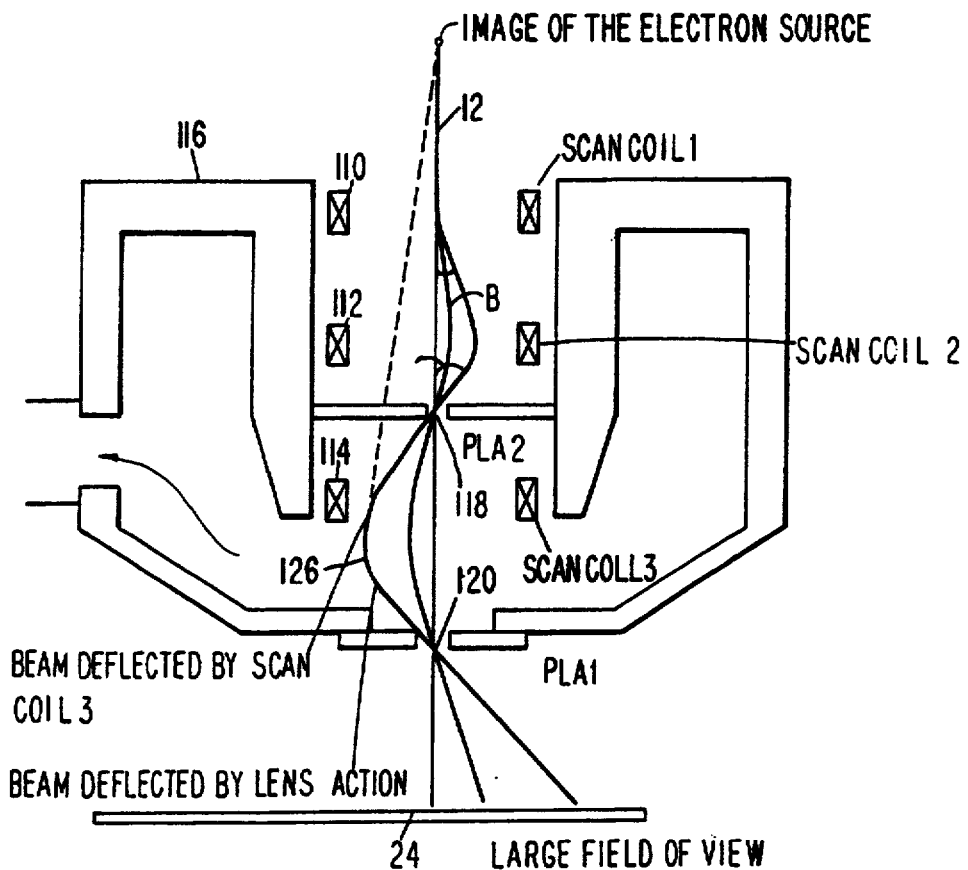
FIG. 15 is a schematic representation of one embodiment of an environmental scanning electron microscope in accordance with the teachings of the present invention wherein the field-of-view of the specimen is increased.

In the preferred embodiment, the environmental scanning electron microscope of the present invention also provides an enhanced field-of-view of the specimen which is comparable with the field-of-view achieved in a conventional SEM. As is shown more particularly in FIG. 15, the enhanced field-of-view is achieved by utilizing three sets of scanning coils 110, 112, and 114 directing the electron beam through two pressure limiting apertures 118 and 120, and a shorter focal length magnetic lens 116. Moreover, the sets of scanning coils 110 and 112 are positioned above pressure limiting aperture 118 and the set of scanning coils 114 is positioned between pressure limiting aperture 118 and final pressure limiting aperture 120.

Without the assistance of the scanning coils or the pressure limiting apertures, electrons emanating from the electron beam are focused onto the sample 24 by the action of the magnetic lens, such as 116. The electrons at the edge of the ray bundle are considerably deflected by the action of the lens. If, however, the focal length of the lens is reduced, as is the magnetic lens 116 of the environmental SEM of FIG. 15, by increasing the current through the lens winding, the ray bundle will pass through a point closer to the magnetic lens. The effects of the shorter focal length lens with respect to the environmental scanning electron microscope of FIG. 15 will be explained in more detail below.

In operation, the first set of scanning coils 110 deflects the electron beam 12 angularly outwardly as is represented by angle $\beta$, toward the second set of scanning coils 112 which are positioned relatively close to the upper pressure limiting aperture 118. The second set of scanning coils 112 deflects the electron beam angularly inwardly, as is represented by the angle $\Phi$, through the upper pressure limiting aperture 118 toward the third set of scanning coils 114. The third set of scanning coils 114 deflects the beam angularly inwardly so that its apparent trajectory is from the image of the electron source. Since the magnetic focusing lens 116 has a short focal length, the lens focusing action will bend the beam as at point 124 to pass the beam through the lower pressure limiting aperture 120. The combination of the three sets of scanning coils 110, 112, and 114 and the magnetic focusing lens 116 of short focal length allows the beam to strike a greater surface area of the specimen 24 (e.g., up to 10 mm in diameter) due to its angular displacement. As a result thereof, the field-of-view of the specimen is enhanced and secondary electrons and other available information (such as X-rays, ions, etc.) issuing from a greater surface area of the specimen can be detected.

As a result of the present invention, an environmental scanning electron microscope has been designed which achieves standard SEM resolution performance in a gaseous environment. Thus, applicants have demonstrated that it is possible to use a suitably modified SEM as is set forth herein to observe samples in water vapor without the water vapor producing any significant degradation of the beam spot diameter and have produced a detector and signal processing chain where the image noise is limited only by the shot noise in the electron beam, and not by any instrumentation limitations.

Although the invention has been particularly shown and described with reference to certain preferred embodiments, it will be readily appreciated by those of ordinary skill in the art that various changes and modifications may be made therein without departing from the spirit and scope of the invention. It is intended that the appended claims be interpreted as including the foregoing as well as various other such changes and modifications.

What is claimed is:

1. An environmental scanning electron microscope comprising:
    (a) means for generating and directing an electron beam towards a specimen;
    (b) means for detecting secondary electron signals emanating from the surface of the specimen; and
    (c) means for reducing signals emanating from backscattered electrons and means for reducing signal noise generated by said electron beam.

2. The environmental scanning electron microscope of claim 1 wherein said means for detecting secondary electrons signal emanating from the surface of the specimen is formed of a thin ring electrode.

3. The environmental scanning electron microscope of claim 2 wherein said thin ring electrode is a wire having a wire thickness of approximately 50 to 1000 microns.

4. The environmental scanning electron microscope of claim 2 wherein said ring electrode is made of an electrically conductive material.

5. The environmental scanning electron microscope of claim 2 wherein said ring electrode is biased at between 200 and 2000 volts.

6. The environmental scanning electron microscope of claim 5 wherein said ring electrode is biased at approximately 500 volts.

7. The environmental scanning electron microscope of claim 1 wherein said electron beam is directed through a pressure limiting aperture at a lower end of a vacuum column and said means for reducing signals emanating from backscattered electrons and means for reducing signal noise generated by said electron beam is a biased electrode formed integrally with said pressure limiting aperture.

8. The environmental scanning electron microscope of claim 7 wherein said pressure limiting aperture electrode is biased at approximately 200 to 2000 volts.

9. The environmental scanning electron microscope of claim 8 wherein said pressure limiting aperture electrode is biased at approximately 500 volts.

10. An environmental scanning electron microscope comprising:
    (a) a vacuum column having a pressure limiting aperture at the lower end thereof;
    (b) a charged particle beam source located within the vacuum column which emits a charged particle beam;
    (c) focusing means located within the vacuum column which directs a charged particle beam emitted by the charged particle beam source through said pressure limiting aperture;
    (d) a specimen chamber, positioned below said pressure limiting aperture, which maintains the specimen enveloped in gas at a pressure of approximately 1 to 50 Torr in registration with the pressure limiting aperture such that a surface of the sample may be exposed to a charged particle beam emitted from the charged particle beam source and directed through said pressure limiting aperture;
    (e) a biased ring detector disposed between said specimen and said pressure limiting aperture to detect secondary electron signals emanating from the surface of the specimen; and
    (f) a biased pressure limiting aperture detector formed integrally with said pressure limiting aperture to reduce signals emanating from backscattered electrons and to reduce noise generated by said electron beam.

11. The environmental scanning electron microscope of claim 10 wherein said ring electrode is a metal wire having a wire thickness of approximately 50 to 1000 microns.

12. The environmental scanning electron microscope of claim 10 wherein said ring electrode and said pressure limiting aperture electrode are biased at the same positive electrical potential.

13. The environmental scanning electron microscope of claim 10 wherein said ring electrode and said pressure limiting aperture electrode are biased at between approximately 200 and 2000 volts.

14. The environmental scanning electron microscope of claim 10 wherein said ring electrode and said pressure limiting aperture electrode are biased at approximately 500 volts.

15. A scanning electron microscope comprising:

(a) means for generating and directing an electron beam towards a specimen;

(b) a specimen chamber which maintains the specimen enveloped in a gaseous environment;

(c) means for detecting secondary electron signals emanating from the surface of the specimen; and (d) means for reducing signals emanating from backscattered electrons and means for reducing signal noise generated by said electron beam.

16. The scanning electron microscope of claim 15 wherein said means for detecting secondary electrons signal emanating from the surface of the specimen is formed of a thin ring electrode.

17. The scanning electron microscope of claim 16 wherein said thin ring electrode is a wire having a wire thickness of approximately 50 to 1000 microns.

18. The scanning electron microscope of claim 16 wherein said ring electrode is made of an electrically conductive material.

19. The scanning electron microscope of claim 16 wherein said ring electrode is biased at between 200 and 2000 volts.

20. The scanning electron microscope of claim 19 wherein said ring electrode is biased at approximately 500 volts.

21. The scanning electron microscope of claim 15 wherein said electron beam is directed through a pressure limiting aperture at a lower end of a vacuum column and said means for reducing signals emanating from backscattered electrons and means for reducing signal noise generated by said electron beam is a biased electrode formed integrally with said pressure limiting aperture.

22. The scanning electron microscope of claim 21 wherein said pressure limiting aperture electrode is biased at approximately 200 to 2000 volts.

23. The scanning electron microscope of claim 22 wherein said pressure limiting aperture electrode is biased at approximately 500 volts.

24. An environmental scanning electron microscope comprising:

(a) means for generating and directing an electron beam toward a specimen;

(b) means for detecting secondary electron signals emanating from the surface of the specimen which is in the form of a thin biased ring electrode;

(c) means for reducing signals emanating from backscattered electrons and means for reducing signal noise generated by said electron beam; and (d) means for amplifying signals collected by said ring electrode including an amplifier receiving signals collected at said ring electrode, said amplifier floating at the bias voltage of said ring electrode, and the output of said amplifier being supplied to display means.

25. The environmental scanning electron microscope of claim 24 wherein said amplifier includes feedback means.

26. The environmental scanning electron microscope of claim 25 wherein said feedback means includes a resistor having a resistance value of R greater than 1M ohm .

27. The environmental scanning electron microscope of claim 26 wherein the output signal of said amplifier is amplified to restore the high frequency signal lost due to the effect of R.

28. The environmental scanning electron microscope of claim 24 wherein said amplifier is operated in virtual earth mode.

29. An environmental scanning electron microscope which permits a substantial portion of a specimen to be examined by an operator comprising:

(a) a vacuum column having a pressure limiting aperture at the lower end thereof;

(b) means for generating and directing an electron beam through said pressure limiting aperture toward a specimen;

(c) a specimen chamber, positioned below said pressure limiting aperture, which maintains the specimen enveloped in gas in registration with the pressure limiting aperture;

(d) a magnetic focusing lens separating said vacuum column and said specimen chamber and defining said pressure limiting aperture; and (e) an optical window system including optical image production means for illuminating said specimen from a light source and for reflecting said image of said specimen to video means to provide a continuous optical view of the specimen.

30. The environmental scanning electron microscope of claim 29 wherein said optical image production means includes mirror means mounted to said magnetic focusing lens and facing said specimen.

31. The environmental scanning electron microscope of claim 30 wherein said video means includes a TV camera which receives the image of the sample from said mirror means and transmits a TV signal to a display monitor to provide a continuous optical view of the specimen.

32. The environmental scanning electron microscope of claim 30 wherein before reaching said mirror means the light of said optical video system is transmitted through an optical fiber bundle and a lead glass window which provides a vacuum seal and absorbs X-rays generated by said electron beam in said specimen.

33. The environmental scanning electron microscope of claim 32 wherein after passing through said lead glass window, the light is focused by a first lens and then reflected off said mirror means onto said specimen.

34. The environmental scanning electron microscope of claim 30 wherein said mirror means reflects the image of the sample through a second lens before reaching said video means.

35. The environmental scanning electron microscope of claim 34 wherein said video means includes a CCD imaging chip.

36. The environmental scanning electron microscope of claim 35 wherein said second lens and said CCD imaging chip are mounted at an angle in order to obtain an image of said sample which is substantially equivalent to a top down view.

37. The environmental scanning electron microscope of claim 34 wherein the image of the sample passes through at least one prism between said second lens and said video means.

38. A scanning electron microscope which allows an optical view of the specimen comprising:

(a) a vacuum column having a pressure limiting aperture at the lower end thereof;

(b) means for generating and directing an electron beam through said pressure limiting aperture toward a specimen;

(c) a specimen chamber, positioned below said pressure limiting aperture, which maintains the specimen enveloped in gas in registration with the pressure limiting aperture;

(d) a magnetic focusing lens separating said vacuum column and said specimen chamber and defining said pressure limiting aperture; and (e) an optical window system including optical image production means for illuminating said specimen from a light source and for reflecting said image of said specimen to video means to provide a continuous optical view of the specimen.

39. The scanning electron microscope of claim 38 wherein said optical image production means includes mirror means mounted to said magnetic focusing lens and facing said specimen.

40. The scanning electron microscope of claim 39 wherein before reaching said mirror means the light of said optical video system is transmitted through an optical fiber bundle and a lead glass window which provides a vacuum seal and absorbs X-rays generated by said electron beam in said specimen.

41. The scanning electron microscope of claim 40 wherein after passing through said lead glass window, the light is focused by a first lens and then reflected off said mirror means onto said specimen.

42. The scanning electron microscope of claim 39 wherein said mirror means reflects the image of the sample through a second lens before reaching said video means.

43. The scanning electron microscope of claim 42 wherein said video means includes a CCD imaging chip.

44. The scanning electron microscope of claim 43 wherein said second lens and said CCD imaging are mounted at an angle in order to obtain an image of said sample which is substantially equivalent to a top down view.

45. The scanning electron microscope of claim 42 wherein the image of the sample passes through at least one prism between said second lens and said video means.

46. An environmental scanning electron microscope comprising:

(a) means for generating and directing an electron beam toward a specimen;

(b) means for detecting secondary electron signals emanating from the surface of the specimen to provide electron images of the specimen;

(c) an optical window system including optical image production means for producing optical images of said specimen; and (d) display means including a screen having an image display area and a menu display area for displaying operational and status information for an operator, and wherein either of said electron images or said optical images may be displayed in said image display area.

47. The environmental scanning electron microscope of claim 46 wherein in said image display area electron images may be inserted in said optical images as a picture-in-picture display.

48. The environmental scanning electron microscope of claim 46 wherein in said image display area optical images may be inserted in said electron images as a picture-in-picture display.

49. A scanning electron microscope comprising:

(a) means for generating and directing an electron beam toward a specimen;

(b) means for detecting secondary electron signals emanating from the surface of the specimen to provide electron images of the specimen;

(c) an optical window system including optical image production means for producing optical images of said specimen; and (d) display means including a screen having an image display area and a menu display area for displaying operational and status information for an operator, and wherein either of said electron images or said optical images may be displayed in said image display area.

50. The scanning electron microscope of claim 49 wherein in said image display area electron images may be inserted in said optical images as a picture-in-picture display.

51. The scanning electron microscope of claim 49 wherein in said image display area optical images may be inserted in said electron images as a picture-in-picture display.

52. An environmental scanning electron microscope comprising:

(a) means for generating and directing an electron beam towards a specimen;

(b) a vacuum column having a pressure limiting aperture assembly at the lower end thereof;

(c) a specimen chamber in which said specimen is mounted such that a surface of said specimen may be exposed to said electron beam; and (d) an X-ray detector mounted in said specimen chamber to generate X-ray information from X-ray signals emanating from the surface of said specimen, said X-ray detector having a take-off angle of approximately 30°.

53. The environmental scanning electron microscope of claim 52 wherein said vacuum column and said specimen chamber are separated by a final pole piece of a magnetic focusing lens and said pressure limiting aperture assembly extends downwardly from said final pole piece such that the specimen is positioned approximately 1 to 25 mm below said pressure limiting aperture assembly.

54. An environmental scanning electron microscope comprising:

(a) means for generating and directing an electron beam towards a specimen contained in a specimen chamber; and (b) an objective lens assembly having scanning means for providing triple deflection of said electron beam until said beam impinges on a surface of said specimen and further including a magnetic lens housing of reduced focal length to provide a lens focusing action wherein said scanning means and said magnetic lens housing, in combination, achieve a field-of-view of the specimen of about at least 7 mm.

55. The environmental scanning electron microscope of claim 54 wherein said objective lens assembly includes at least two pressure limiting apertures and said scanning means includes at least three sets of scanning coils with the first and second sets of said scanning coils being positioned above both of said pressure limiting apertures and the third set of said scanning coils being positioned between said pressure limiting apertures.

56. The environmental scanning electron microscope of claim 55 wherein said first set of said scanning coils deflects the electron beam angular outwardly to said second set with said second set redirecting the electron beam angularly inwardly through the first of said pressure limiting apertures to said third set of said scanning coils with the third set in conjunction with the lens focusing action deflecting the electron beam angularly inwardly through the second of said pressure limiting apertures into said specimen chamber such that the electron beam strikes a relatively large surface area of the specimen under examination.

* * * * *